(12) United States Patent
Gao

(10) Patent No.: US 12,044,724 B2
(45) Date of Patent: Jul. 23, 2024

(54) CHIP TESTING METHOD AND APPARATUS, AND ELECTRONIC EQUIPMENT

(71) Applicant: CHANGXIN MEMORY TECHNOLOGIES, INC., Hefei (CN)

(72) Inventor: Hang Gao, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 332 days.

(21) Appl. No.: 17/648,149

(22) Filed: Jan. 17, 2022

(65) Prior Publication Data

US 2022/0236322 A1    Jul. 28, 2022

Related U.S. Application Data

(63) Continuation of application No. PCT/CN2021/113353, filed on Aug. 18, 2021.

(30) Foreign Application Priority Data

Jan. 22, 2021    (CN) .......................... 202110087574.7

(51) Int. Cl.
    *G01R 31/28*    (2006.01)
(52) U.S. Cl.
    CPC ..... *G01R 31/2881* (2013.01); *G01R 31/2872* (2013.01); *G01R 31/2896* (2013.01)
(58) Field of Classification Search
    CPC ...................................... G01R 31/2851–2896
    USPC ......................................... 324/750.01–750.3
    See application file for complete search history.

(56) References Cited

U.S. PATENT DOCUMENTS

| 7,885,129 | B2 | 2/2011 | Chang et al. |
| 8,203,896 | B2 | 6/2012 | Chang et al. |
| 2001/0047496 | A1 | 11/2001 | Hidaka et al. |

(Continued)

FOREIGN PATENT DOCUMENTS

| CN | 101593563 A | 12/2009 |
| CN | 102945684 A | 2/2013 |
| CN | 103630824 A | 3/2014 |

(Continued)

OTHER PUBLICATIONS

International Search Report cited in PCT/CN2021/113353 mailed Oct. 27, 2021, 10 pages.

*Primary Examiner* — Alesa Allgood
*Assistant Examiner* — Rahul Maini
(74) *Attorney, Agent, or Firm* — Kilpatrick Townsend & Stockton LLP

(57) ABSTRACT

A chip testing method and apparatus, and an electronic equipment are provided. The method includes: determining, according to pad distribution information of a target chip, positions of set state pads and positions of non-set state pads in the target chip, the set state pads being pads with set states, and the set states including a first state or a second state; determining a plurality of pad state setting schemes according to the positions of the set state pads and the positions of the non-set state pads, the pad state setting schemes including setting each of the non-set state pads to the first state or the second state; and determining a test voltage setting scheme satisfying a preset condition according to information of differential voltage pad pairs in each of the pad state setting schemes, the differential voltage pad pair comprising two adjacent pads in different states.

8 Claims, 7 Drawing Sheets

(56) References Cited

U.S. PATENT DOCUMENTS

| | | | |
|---|---|---|---|
| 2005/0212546 A1 | 9/2005 | Lynch | |
| 2013/0207107 A1* | 8/2013 | Kuo | G01R 31/2884 |
| | | | 438/10 |

FOREIGN PATENT DOCUMENTS

| | | | |
|---|---|---|---|
| CN | 106876366 A | 6/2017 | |
| CN | 110470975 A | 11/2019 | |
| CN | 112904179 A | 6/2021 | |

* cited by examiner

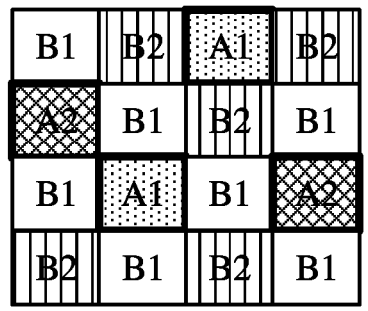

FIG. 4A

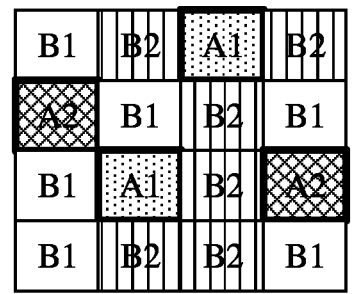

| Obtain a number of differential voltage pad pairs in each of the pad state setting schemes | ∽ S31 |

↓

| Obtain, in the pad state setting scheme with the maximum number of differential voltage pad pairs, a voltage at which each pad set in the first state is in the first state, and a voltage at which each pad set in the second state is in the second state | ∽ S32 |

↓

| Determine the test voltage setting scheme according to the voltage of the first state of each of the pads or the voltage of the second state of each of the pads | ∽ S33 |

| Among target pads included in the differential voltage pad pairs corresponding to the test voltage setting scheme, determine a first target pad with the shortest distance from a first border of the target chip, a second target pad with the shortest distance from a second border of the target chip, a third target pad with the shortest distance from a third border of the target chip, and a fourth target pad with the shortest distance from a fourth border of the target chip, wherein, the first border is parallel to the second border, and the third border is parallel to the fourth border | S351 |

↓

| Determine a first length according to the length of the third border, the distance between the first target pad and the first border, and the distance between the second target pad and the second border | S352 |

↓

| Determine a second length according to the length of the first border, the distance between the third target pad and the third border, and the distance between the fourth target pad and the fourth border | S353 |

↓

| Determine, according to the product of the first length and the second length, the occupied area of differential voltage pads corresponding to the pad state setting scheme | S354 |

FIG. 7

CHIP TESTING METHOD AND APPARATUS, AND ELECTRONIC EQUIPMENT

CROSS-REFERENCE TO RELATED APPLICATIONS

The present application is a continuation of International Application No. PCT/CN2021/113353, filed on Aug. 18, 2021, which claims the priority to Chinese Patent Application 202110087574.7, titled "CHIP TESTING METHOD AND APPARATUS, AND ELECTRONIC EQUIPMENT" and filed on Jan. 22, 2021. The entire contents of International Application No. PCT/CN2021/113353 and Chinese Patent Application 202110087574.7 are incorporated herein by reference.

TECHNICAL FIELD

The present disclosure relates to the field of integrated circuit testing technology, and in particular, to a chip testing method and apparatus, and an electronic equipment.

BACKGROUND

After a chip is packaged, HAST (Highly Accelerated Stress Test) is required, that is, the humidity resistance of the chip package is tested. After the chip is connected to an external power source and a HAST board, the chip is tested under harsh temperature, humidity and voltage conditions. If the chip runs well, it indicates that the package is well sealed, moisture cannot penetrate into the package along a glue or an interface between the glue and a lead frame to damage the chip, and the high-temperature and high-humidity environment cannot affect the metal interconnect structure in the chip.

It should be noted that the information disclosed in the background section above is only used to enhance the understanding of the background of the present disclosure, and therefore may include information that does not constitute the prior art known to those of ordinary skill in the art.

SUMMARY

The objective of the present disclosure is to provide a chip testing method and apparatus, and an electronic equipment.

According to the first aspect of the embodiments of the present disclosure, a chip testing method is provided, including: determining, according to pad distribution information of a target chip, positions of set state pads and positions of non-set state pads in the target chip, the set state pads being pads with set states, and the set states including a first state or a second state; determining a plurality of pad state setting schemes according to the positions of the set state pads and the positions of the non-set state pads, the pad state setting schemes including setting each of the non-set state pads to the first state or the second state; and determining a test voltage setting scheme satisfying a preset condition according to information of differential voltage pad pairs in each of the pad state setting schemes, the differential voltage pad pair comprising two adjacent pads in different states.

According to the second aspect of the embodiments of the present disclosure, a chip testing apparatus is provided, including: one or more processors; and a storage apparatus, configured to store one or more programs, wherein the one or more programs, when executed by the one or more processors, cause the one or more processors to execute operations of: determining, according to pad distribution information of a target chip, positions of set state pads and positions of non-set state pads in the target chip, the set state pads being pads with set states, and the set states including a first state or a second state; determining a plurality of pad state setting schemes according to the positions of the set state pads and the positions of the non-set state pads, the pad state setting schemes including setting each of the non-set state pads to the first state or the second state; determining a test voltage setting scheme satisfying a preset condition according to information of differential voltage pad pairs in each of the pad state setting schemes, the differential voltage pad pair consisting of two adjacent pads in different states.

According to the third aspect of the present disclosure, a computer-readable storage medium is provided, storing a program thereon, wherein when the program is executed by a processor, the chip testing method as described in any one of the above is implemented.

It should be understood that the above general description and the following detailed description are only exemplary and explanatory, and cannot limit the present disclosure.

BRIEF DESCRIPTION OF THE DRAWINGS

The accompanying drawings herein are incorporated into the specification and constitute a part of the specification, show embodiments consistent with the present disclosure, and are used to explain the principle of the present disclosure together with the specification. Apparently, the drawings described below are only some of the drawings of the present disclosure, and other drawings may also be obtained by those of ordinary skill in the art according to these drawings without any creative efforts.

FIGS. 4A and 4B are schematic diagrams of pad state setting schemes in another embodiment of the present disclosure.

FIG. 5 is a sub-flowchart of step S3 in an embodiment of the present disclosure.

FIG. 7 is a sub-flowchart of step S35 in another embodiment of the present disclosure.

DETAILED DESCRIPTION

Figure 1:
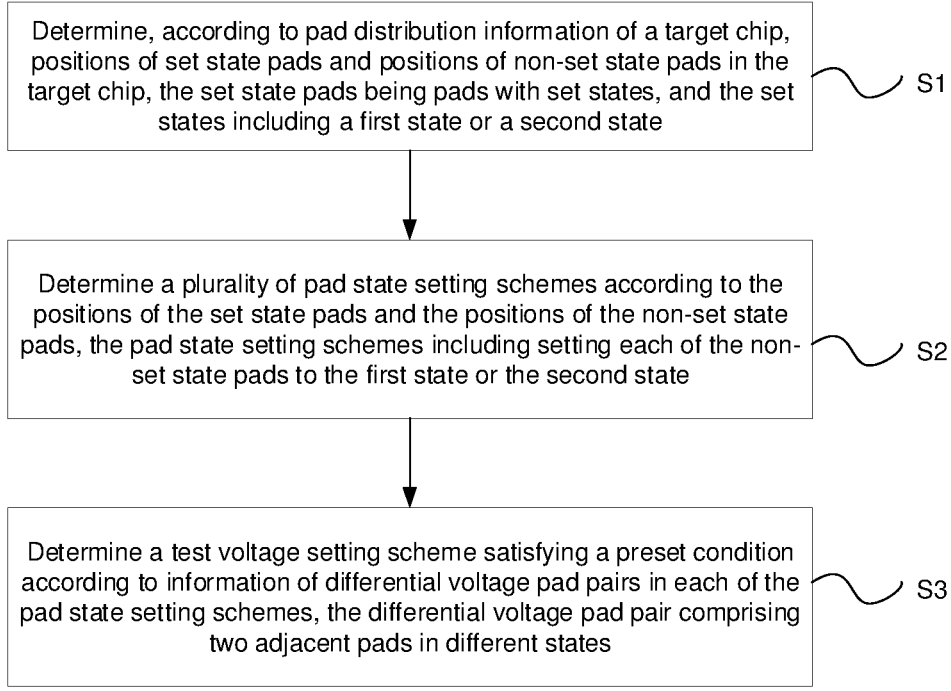
FIG. 1 is a flowchart of a chip testing method in an exemplary embodiment of the present disclosure.

Example embodiments are now described more comprehensively with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. The features, structures or characteristics described may be combined in one or more embodiments in any suitable way. In the following description, many specific details are provided to provide a sufficient understanding of the embodiments of the present disclosure. However, those skilled in the art would realize that the technical solutions of the present disclosure may be practiced without one or more of the specific details, or other methods, components, apparatuses, steps, etc. may be used. In other cases, the well-known technical solutions are not shown or described in detail in order to avoid distracting to obscure all aspects of the present disclosure.

In addition, the drawings are only schematic illustrations of the present disclosure, the same reference numerals in the drawings denote the same or similar parts, and repeated descriptions thereof are thereby omitted. Some of the block diagrams shown in the drawings are functional entities and do not necessarily correspond to physically or logically independent entities. These functional entities may be implemented in the form of software, or implemented in one or more hardware modules or integrated circuits, or implemented in different networks and/or processor units and/or microcontroller units.

The exemplary embodiments of the present disclosure will be described in detail below with reference to the accompanying drawings.

FIG. 1 is a flowchart of a chip testing method in an exemplary embodiment of the present disclosure.

Referring to FIG. 1, the chip testing method 100 may include:

Step S1, determining, according to pad distribution information of a target chip, positions of set state pads and positions of non-set state pads in the target chip, the set state pads being pads with set states, and the set states including a first state or a second state;

Step S2, determining a plurality of pad state setting schemes according to the positions of the set state pads and the positions of the non-set state pads, the pad state setting schemes including setting each of the non-set state pads to the first state or the second state; and Step S3, determining a test voltage setting scheme satisfying a preset condition according to information of differential voltage pad pairs in each of the pad state setting schemes, the differential voltage pad pair consisting of two adjacent pads in different states.

In the embodiments of the present disclosure, a plurality of pad state setting schemes for setting adjacent pads to different states are determined according to the positional arrangement of pads in the chip, and then a test voltage setting scheme is determined according to the pad state setting schemes, which can maximize the operating differential voltage between adjacent pads in the finally selected test voltage setting scheme, thereby effectively improving the voltage test intensity when the chip participates in an environmental test, and improving the reliability of the environmental test result.

HAST accelerates the failure of chip metal systems due to mobile ion contamination, as well as functional degradation of a passivation layer and a circuit. Bias voltages applied to chip pins aggravate the electrochemical reaction due to the contamination, so the stress test can improve the rigor of HAST and then improve the reliability of the test result. Therefore, the embodiment of the present disclosure sets the test voltage setting scheme by determining the voltage relationship between the pads.

Hereinafter, each step of the chip testing method 100 will be described in detail.

The method 100 may be implemented by computer calculations.

In step S1, positions of set state pads and positions of non-set state pads in a target chip are determined according to pad distribution information of the target chip, the set state pads being pads with set states, and the set states including a first state or a second state.

In the embodiment of the present disclosure, the set state pad refers to a pad that can only be connected to a certain voltage or must be connected to a certain voltage for certain test purpose. For example, the set state pads may include power pads, ground pads and set bias pads, wherein the set bias pads are configured to set the target chip in a low power consumption state during the test.

In contrast, the non-set state pads refer to pads other than the set state pads, such as input and output (IO) pads and data pads.

In one embodiment, the first state of each pad is a design maximum voltage state connected to the pad, and the second state is a design minimum voltage state connected to the pad. Of course, the second state may be set as the connection design maximum voltage state, and the first state may be set as the connection design minimum voltage state. The design minimum voltage state of the pad may be, for example, a ground state or a negative voltage connection state.

The power pad among the set state pads is set to the first state in all the finally formed pad state setting schemes, that is, to connect its design voltage, for example, the 3.3V pad is set to connect 3.3V voltage; the ground pad among the set state pads is set to the second state in all the finally formed pad state setting schemes, for example, the GND pad is set to ground; for the set bias pad among the set state pads, the voltage at which the pad should be, such as 1.2V, may be determined according to the information provided in the chip manual when the pad participates in setting the target chip in a low power consumption state (the low power consumption state has a unique definition in each chip) during the test, and then the set bias pad is set to the first state in all the finally formed pad state setting schemes to connect 1.2V voltage.

For the non-set state pad, such as the input and output pad or the data pad, the maximum voltage and minimum voltage to which the pad can be connected can be determined according to the information provided in the chip manual, and then voltages corresponding to the first state and the second state can be determined.

In step S2, a plurality of pad state setting schemes are determined according to the positions of the set state pads and the positions of the non-set state pads, the pad state setting schemes including setting each of the non-set state pads to the first state or the second state.

Figure 2:
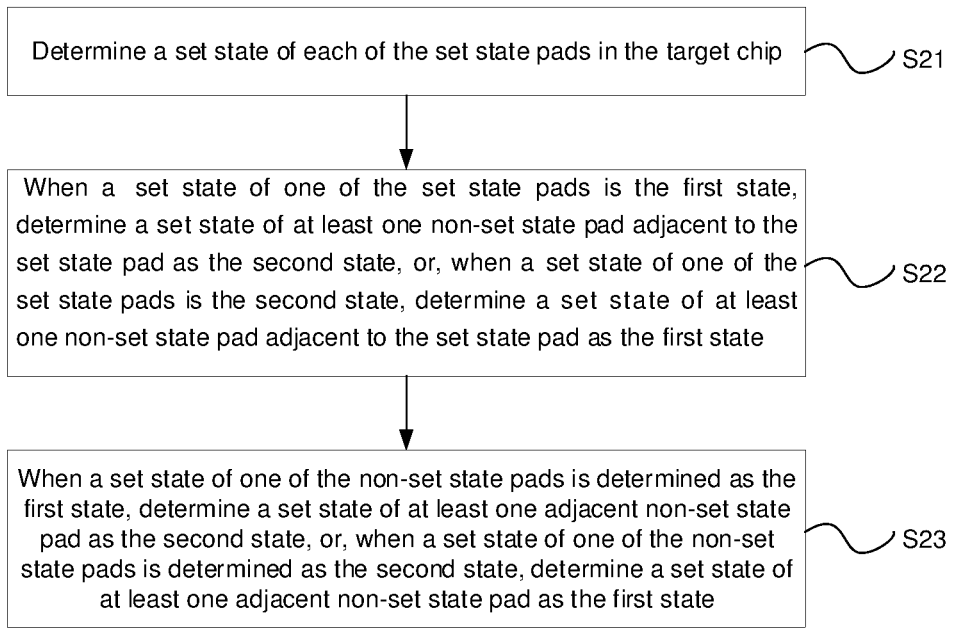
FIG. 2 is a sub-flowchart of step S2 in an embodiment of the present disclosure.

FIG. 2 is a sub-flowchart of step S2 in an embodiment of the present disclosure.

Referring to FIG. 2, step S2 may include:

Step S21, determining a set state of each of the set state pads in the target chip;

Step S22, when a set state of one of the set state pads is the first state, determining a set state of at least one non-set state pad adjacent to the set state pad as the second state, or, when a set state of one of the set state pads is the second state, determining a set state of at least one non-set state pad adjacent to the set state pad as the first state;

Step S23, when a set state of one of the non-set state pads is determined as the first state, determining a set state of at least one adjacent non-set state pad as the second state, or, when a set state of one of the non-set state pads is determined as the second state, determining a set state of at least one adjacent non-set state pad as the first state.

In the embodiment shown in FIG. 2, first, a pad (set voltage pad) connected to an unchangeable voltage may be found, and its position is recorded. Next, the state of each non-set state pad is determined according to the logics of steps S22 and S23.

In some embodiments, the state of the adjacent pad of one pad may be the same as the state of the pad (two adjacent pads are in the second state or in the first state). This situation is usually determined by the position of the set state pad. For example, when the pad 1 is a set state pad in the first state, and the adjacent pad 3 of the adjacent pad 2 is a set state pad in the second state, then no matter which state the pad 2 is set to, the pad 2 will be in the same state as at least one adjacent pad and cannot form a differential voltage pad. Therefore, the pads with selectable states can be set to the first state or the second state respectively, thereby generating two very similar pad state setting schemes, which will be screened based on preset screening criteria in the subsequent steps.

Since there are many similar situations in the chip, a plurality of pad state setting schemes can be generated for selection.

Figure 3A:
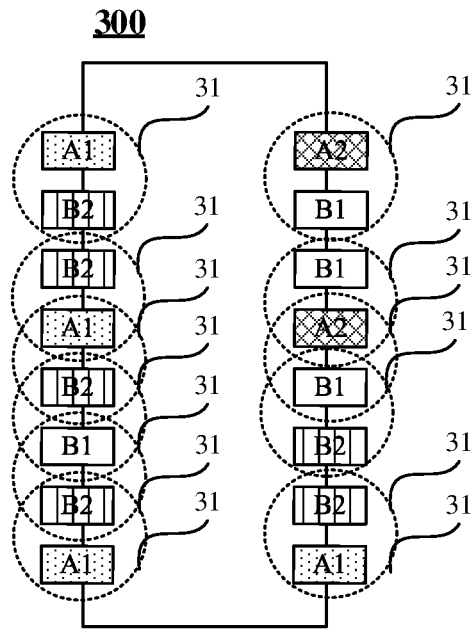
FIGS. 3A and 3B are schematic diagrams of pad state setting schemes in an embodiment of the present disclosure.
Figure 3B:
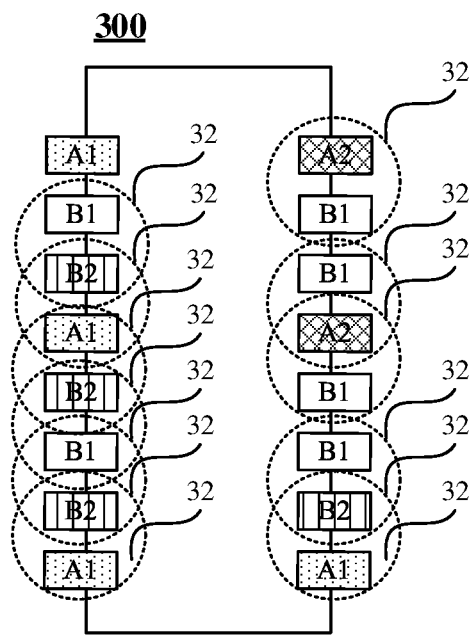

FIGS. 3A and 3B are respectively schematic diagrams of pad state setting schemes in an embodiment of the present disclosure.

Referring to FIGS. 3A and 3B, the chip 300 includes a plurality of set state pads and a plurality of non-set state pads. When the set state of a set state pad is the first state, it is denoted as A1, and when the set state is the second state, it is denoted as A2; when the state of a non-set state pad is the first state, it is denoted as B1, and when the state is the second state, it is denoted as B2. When the states of two adjacent pads are different, the two pads are referred to as a differential voltage pad pair, such as the differential voltage pad pair 31 in FIG. 3A and the differential voltage pad pair 32 in FIG. 3B.

In FIGS. 3A and 3B, the position and state of the set state pad remain unchanged. In order to form a differential voltage pad pair with a different set state pad, each non-set state pad has one or two state options.

In the pad schemes shown in FIGS. 3A and 3B, the pads are arranged in two parallel rows on the chip. In other embodiments, the pads may also be arranged in multiple rows and multiple columns. In this case, the formation of differential voltage pad pairs is similar to that of FIGS. 3A and 3B.

FIGS. 4A and 4B are schematic diagrams of arrangement of differential voltage pad pairs in another embodiment of the present disclosure. In order to highlight, the borders of the set state pads are bold in FIGS. 4A and 4B.

In FIG. 4A, three differential voltage pad pairs are formed around the set pads in the first row, three differential voltage pad pairs are formed around the set pads in the second row, three differential voltage pad pairs are formed around the set pads on the right of the third row, and no differential voltage pad pair is formed around the set pads on the left of the third row. In FIG. 4B, the differential voltage pad pairs in the first row and the second row are the same, two differential voltage pad pairs are formed around the set pads on the right of the third row, and two differential voltage pad pairs are formed around the set pads on the left of the third row. Therefore, when the non-set state pads are in different states, a plurality of pad state setting schemes can be formed. In each pad state setting scheme, the states of adjacent pads may be the same. Therefore, the pad state setting schemes need to be evaluated, to determine which scheme can maximize the differential voltage distribution between bonding pads. Due to the small distance between the pad pairs, the corrosion zone formed by the electrochemical reaction of mobile ions easily results in circuit failure. Therefore, maximizing the differential voltage distribution between bonding pads can form the most severe HAST stress environment.

In step S3, a test voltage setting scheme satisfying a preset condition is determined according to information of differential voltage pad pairs in each of the pad state setting schemes.

In the embodiment of the present disclosure, a pad state setting scheme for maximizing the differential voltage distribution between bonding pads may be determined first according to the number of differential voltage pad pairs or the occupied areas distributed in the chip.

FIG. 5 is a sub-flowchart of step S3 in an embodiment of the present disclosure.

Referring to FIG. 5, step S3 may include:

Step S31, obtaining a number of differential voltage pad pairs in each of the plurality of pad state setting schemes;

Step S32, obtaining, in the pad state setting scheme with the maximum number of differential voltage pad pairs, a voltage at which each pad set in the first state is in the first state, and a voltage at which each pad set in the second state is in the second state;

Step S33, determining the test voltage setting scheme according to the voltage of the first state of each of the pads or the voltage of the second state of each of the pads.

The embodiment shown in FIG. 5 determines the pad state setting scheme with the maximum number of differential voltage pad pairs as an optimal pad state setting scheme, manufactures the maximum number of differential voltage pad pairs in the chip, and then obtains a test voltage setting scheme through the voltages of each pad in the first state and the second state checked in the previous step.

Figure 6:
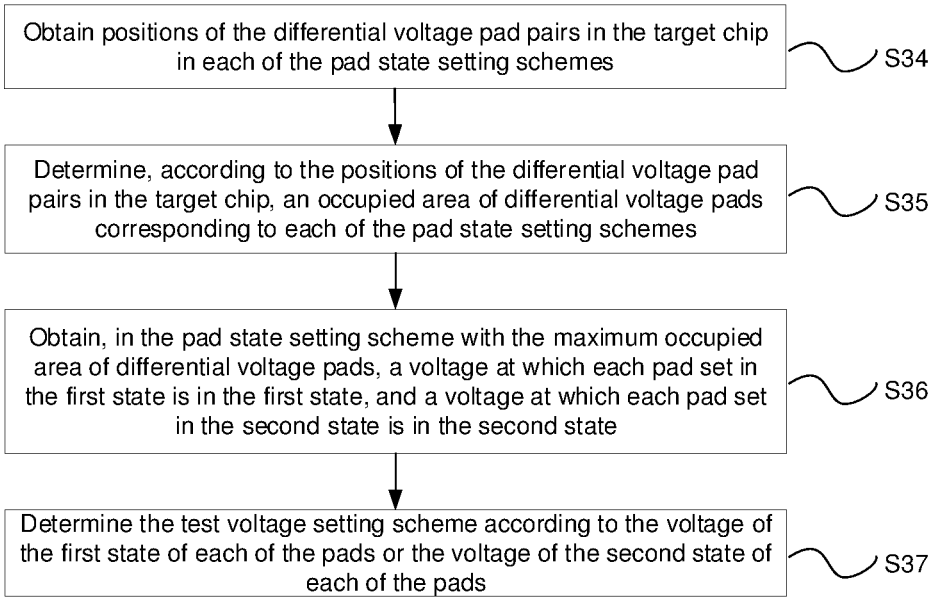
FIG. 6 is a sub-flowchart of step S3 in another embodiment of the present disclosure.

FIG. 6 is a sub-flowchart of step S3 in another embodiment of the present disclosure.

Referring to FIG. 6, step S3 may further include:

Step S34, obtaining positions of the differential voltage pad pairs in the target chip in each of the plurality of pad state setting schemes;

Step S35, determining, according to the positions of the differential voltage pad pairs in the target chip, an occupied area of differential voltage pads corresponding to each of the pad state setting schemes;

Step S36, obtaining, in the pad state setting scheme with the maximum occupied area of differential voltage pads, a voltage at which each pad set in the first state is in the first state, and a voltage at which each pad set in the second state is in the second state;

Step S37, determining the test voltage setting scheme according to the voltage of the first state of each pad or the voltage of the second state of each pad.

In the pad embodiments shown in FIGS. 3A and 3B of the present disclosure, since the pads are arranged in two rows on the chip, usually in the scheme with the maximum number of differential voltage pad pairs, the occupied area of the differential voltage pad pairs is also maximum. However, the scheme with the maximum number of differential voltage pad pairs may also be different from the scheme with the maximum occupied area of the differential voltage pad pairs. As such, the test voltage setting scheme can be selected according to a preset selection preference.

The number of differential voltage pad pairs is 13 in FIG. 3A, and the number of differential voltage pad pairs is also 13 in FIG. 3B. Viewed from the occupied area of the differential voltage pad pairs, there is a differential voltage pad pair at the upper left corner of the embodiment shown in FIG. 3A, but there is no differential voltage pad pair at the upper left corner of the embodiment shown in FIG. 3B. Thus, in terms of the distribution area of the differential voltage pad pairs, the distribution area in FIG. 3A is greater than that in FIG. 3B. As such, the test voltage setting scheme can be determined according to the pad setting scheme shown in FIG. 3A.

In other embodiments, for example, in the pad setting mode shown in FIGS. 4A and 4B, the occupied area of the differential voltage pad pairs may also be determined in different ways.

FIG. 7 is a sub-flowchart of step S35 in another embodiment of the present disclosure.

Referring to FIG. 7, step S35 may further include:

Step S351, among target pads included in the differential voltage pad pairs corresponding to the test voltage setting scheme, determining a first target pad with the shortest distance from a first border of the target chip, a second target pad with the shortest distance from a second border of the target chip, a third target pad with the shortest distance from a third border of the target chip, and a fourth target pad with the shortest distance from a fourth border of the target chip, wherein, the first border is parallel to the second border, and the third border is parallel to the fourth border;

Step S352, determining a first length according to the length of the third border, the distance between the first target pad and the first border, and the distance between the second target pad and the second border;

Step S353, determining a second length according to the length of the first border, the distance between the third target pad and the third border, and the distance between the fourth target pad and the fourth border;

Step S354: determining, according to the product of the first length and the second length, the occupied area of differential voltage pads corresponding to the pad state setting scheme.

Figure 8:
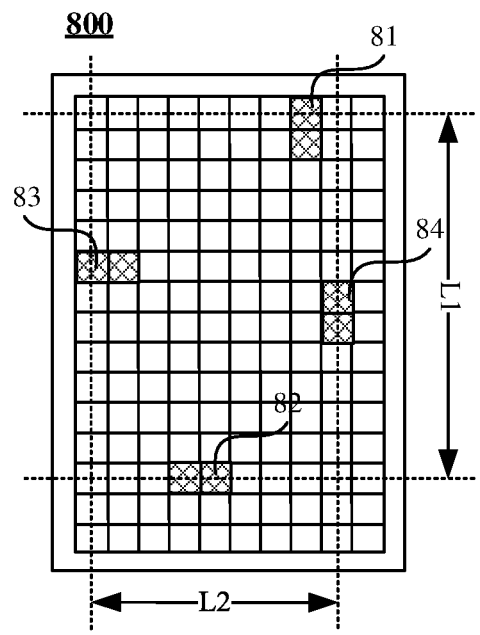
FIG. 8 is a schematic diagram of the embodiment shown in FIG. 6.

FIG. 8 is a schematic diagram of the embodiment shown in FIG. 7.

Referring to FIG. 8, in the pad setting mode shown in FIGS. 4A and 4B, the first target pad 81, the second target pad 82, the third target pad 83, and the fourth target pad 84 are respectively pads in the differential voltage pad pairs closest to the four borders of the target chip 800. The first length L1 is the distance between the first target pad 81 and the second target pad 82, which can be obtained by step S352; the second length L2 is the distance between the third target pad 83 and the fourth target pad 84, which can be obtained by step S353. According to the product of L1 and L2, the occupied area of differential voltage pads corresponding to the pad state setting scheme can be obtained, so as to determine the pad state setting scheme with the maximum occupied area of differential voltage pads.

The embodiment shown in FIGS. 6 to 8 determines the pad state setting scheme with the widest distribution of differential voltage pad pairs as the optimal pad state setting scheme, manufactures the maximum area of differential voltage pad pairs in the chip, and then obtains a test voltage setting scheme through the voltages of each pad in the first state and the second state checked in the previous step.

Figure 9:
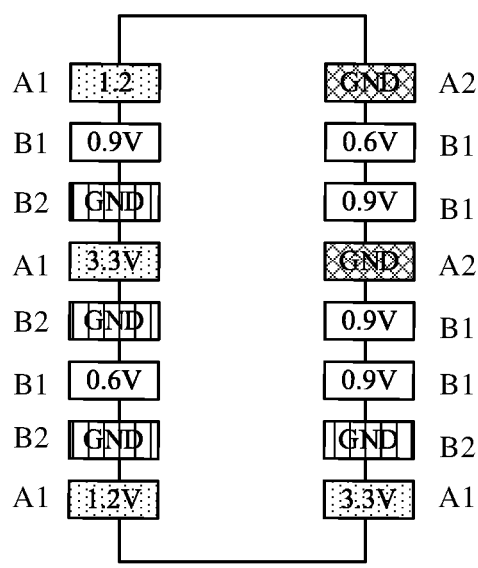
FIG. 9 is a schematic diagram of a test voltage setting scheme corresponding to the pad state setting scheme shown in FIG. 3A.

FIG. 9 is a schematic diagram of a test voltage setting scheme corresponding to the pad state setting scheme shown in FIG. 3A.

Referring to FIG. 9, in the pad state setting scheme shown in FIG. 3A that is determined to be optimal, the set state pads A1 set in the first state correspond to 1.2V and 3.3V respectively, and the set state pads A2 set in the second state are all grounded (the connection voltage is GND). The non-set state pads B2 set in the second state are all grounded (the connection voltage is GND), and the non-set state pads B1 set in the first state can be connected to different maximum voltages such as 0.9V to 0.6V according to the chip manual.

After the test voltage setting scheme is determined, solder balls of the target chip can be pressurized based on the test voltage setting scheme according to the corresponding relationship between the pads of the target chip and the solder balls, and an environmental test can be performed on the target chip.

Generally, the implementation process of the present application includes the following steps:
1. Determine the maximum working voltage and minimum working voltage of each pad of the chip;
2. Assign specific bias voltages to specific pads such that the chip is in a low power consumption state;
3. Determine the number of pad pairs that can produce the maximum adjacent differential voltage, or enable the structure with the maximum adjacent differential voltage to have the widest coverage in a chip metal interconnect system to determine the test voltage setting scheme.

Based on the above, by designing the bias voltage distribution of chip pads, the embodiment of the present disclosure allows the chip to be in a low power consumption state and maximizes alternating differential voltage pad pairs with maximum differential voltage in the metal interconnect system, to form a highly accelerated stress test environment that meets the requirements of the specification to a greater extent, so as to accurately reflect the reliability of a product package.

Corresponding to the foregoing method embodiment, the present disclosure further provides a chip testing apparatus that can be used to execute the foregoing method embodiment.

Figure 10:
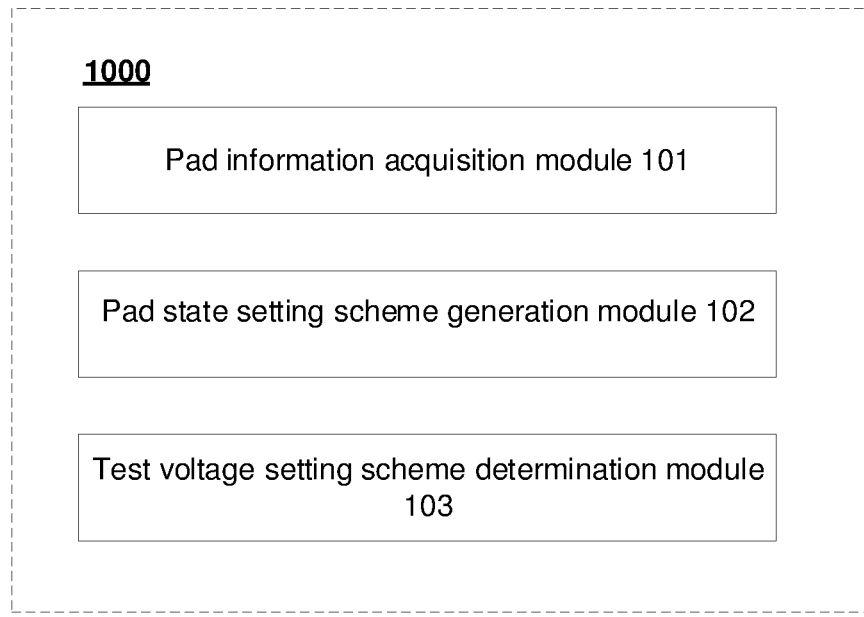
FIG. 10 is a block diagram of a chip testing apparatus in an exemplary embodiment of the present disclosure.

FIG. 10 is a block diagram of a chip testing apparatus in an exemplary embodiment of the present disclosure.

Referring to FIG. 10, the chip testing apparatus 1000 may include:

a pad information acquisition module 101, configured to determine, according to pad distribution information of a target chip, positions of set state pads and positions of non-set state pads in the target chip, the set state pads being pads with set states, and the set states including a first state or a second state;

a pad state setting scheme generation module 102, configured to determine a plurality of pad state setting schemes according to the positions of the set state pads and the positions of the non-set state pads, the pad state setting schemes including setting each of the non-set state pads to the first state or the second state; and a test voltage setting scheme determination module 103, configured to determine a test voltage setting scheme satisfying a preset condition according to information of differential voltage pad pairs in each of the pad state setting schemes, the differential voltage pad pair consisting of two adjacent pads in different states.

In an exemplary embodiment of the present disclosure, the pad state setting scheme generation module 102 is configured to: determine a set state of each of the set state pads in the target chip; when the set state of one of the set state pads is the first state, determine a set state of at least one non-set state pad adjacent to the set state pad as the second state, or, when the set state of one of the set state pads is the second state, determine a set state of at least one non-set state pad adjacent to the set state pad as the first state; and when one of the non-set state pads is determined as the first state, determine a set state of at least one adjacent non-set state pad as the second state, or, when one of the non-set state pads is determined as the second state, determine a set state of at least one adjacent non-set state pad as the first state.

In an exemplary embodiment of the present disclosure, the test voltage setting scheme determination module 103 is configured to: obtain a number of differential voltage pad pairs in each of the plurality of pad state setting schemes; obtain, in the pad state setting scheme with the maximum number of differential voltage pad pairs, a voltage at which each pad set in the first state is in the first state, and a voltage at which each pad set in the second state is in the second state; and determine the test voltage setting scheme according to the voltage of the first state of each of the pads or the voltage of the second state of each of the pads.

In an exemplary embodiment of the present disclosure, the test voltage setting scheme determination module 103 is configured to: obtain positions of the differential voltage pad pairs in the target chip in each of the plurality of pad state setting schemes; determine, according to the positions of the differential voltage pad pairs in the target chip, an occupied area of differential voltage pads corresponding to each of the pad state setting schemes; obtain, in the pad state setting scheme with the maximum occupied area of differential voltage pads, a voltage at which each pad set in the first state is in the first state, and a voltage at which each pad set in the second state is in the second state; and determine the test voltage setting scheme according to the voltage of the first state of each pad or the voltage of the second state of each pad.

In an exemplary embodiment of the present disclosure, the first state of each pad is a design maximum voltage state connected to the pad, and the second state is a design minimum voltage state connected to the pad.

In an exemplary embodiment of the present disclosure, the set state pads include power pads, ground pads and set bias pads, and the set bias pads are used to set the target chip in a low power consumption state.

Since the functions of the apparatus 1000 are described in detail in the corresponding method embodiment, the present disclosure will not repeat them here.

It should be noted that, although a number of modules or units of the apparatus for operation are mentioned in the above detailed description, this division is not mandatory. In fact, according to the embodiments of the present disclosure, the features and functions of two or more modules or units described above may be embodied in one module or unit. Conversely, the features and functions of a module or unit described above may be further divided into multiple modules or units to be embodied.

In an exemplary embodiment of the present disclosure, an electronic equipment capable of implementing the above method is further provided.

It could be appreciated by those skilled in the art that various aspects of the present invention may be implemented as systems, methods, or program products. Therefore, the various aspects of the present invention may be implemented in the following forms: complete hardware implementations, complete software implementations (including firmware, microcodes, etc.), or combined implementations of hardware and software, which may be collectively referred to as "circuits", "modules", or "systems" herein.

The electronic equipment 1100 according to this embodiment of the present invention will be described below with reference to FIG. 11. The electronic equipment 1100 shown in FIG. 11 is just an example, which does not impose any restrictions on the functions and scope of application of the embodiment of the present invention.

Figure 11:
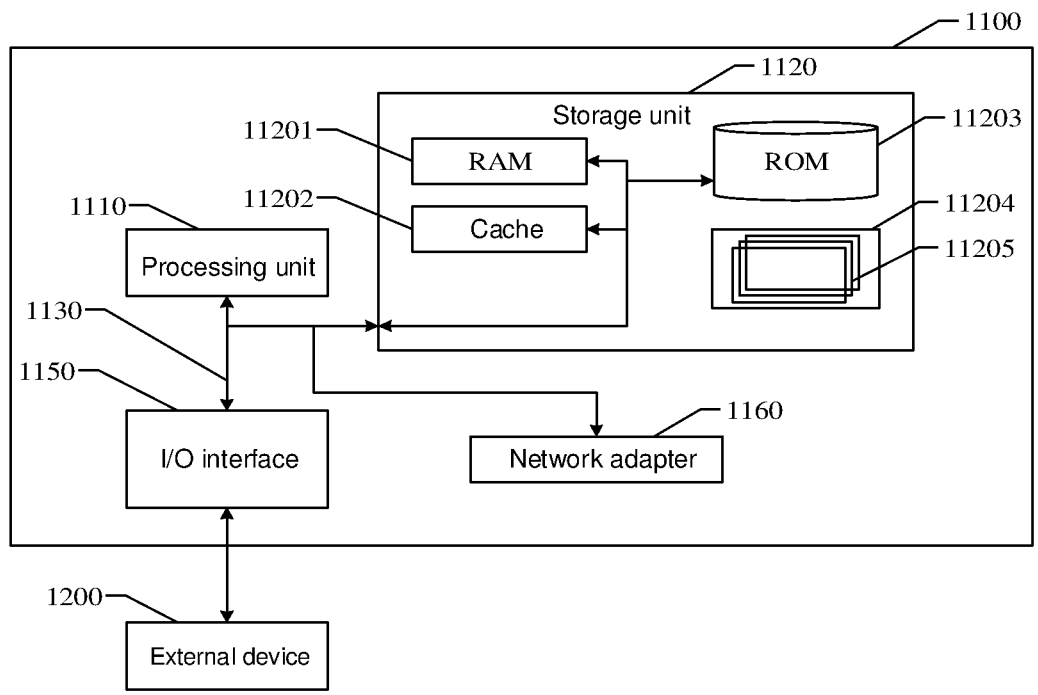
FIG. 11 is a block diagram of an electronic equipment in an exemplary embodiment of the present disclosure.

As shown in FIG. 11, the electronic equipment 1100 is embodied in the form of a general-purpose computing device. The components of the electronic equipment 1100 may include, but are not limited to: the aforementioned at least one processing unit 1110, the aforementioned at least one storage unit 1120, and a bus 1130 connecting different system components (including the storage unit 1120 and the processing unit 1110).

The storage unit stores program codes, and the program codes may be executed by the processing unit 1110, so that the processing unit 1110 performs the steps according to various exemplary implementations of the present invention described in the "exemplary method" section of the specification. For example, the processing unit 1110 may perform the steps shown in FIG. 1.

The storage unit 1120 may include a readable medium in the form of a volatile memory unit, such as a random access memory (RAM) 11201 and/or a cache 11202, and may further include a read-only memory (ROM) 11203.

The storage unit 1120 may also include a program/utility tool 11204 having a group (at least one) of program modules 11205, such program module 11205 including, but not limited to an operating system, one or more applications, other program modules, and program data. Each or a combination of these examples may include the implementation of a network environment.

The bus 1130 may represent one or more of several types of bus structures, including a memory unit bus or memory unit controller, a peripheral bus, a graphics acceleration port, a processing unit, or a local area bus using any of a variety of bus structures.

The electronic equipment 1100 may also communicate with one or more external devices 1200 (e.g., a keyboard, a pointing device, a Bluetooth device, etc.), and may also communicate with one or more devices that enable a user to interact with the electronic equipment 1100, and/or communicate with any device (e.g., a router, a modem, etc.) that enables the electronic equipment 1100 to communicate with one or more other computing devices. The communication may be performed via an input and output (I/O) interface 1150. In addition, the electronic equipment 1100 may also communicate with one or more networks (for example, a local area network (LAN), a wide area network (WAN), and/or a public network, such as the Internet) via a network adapter 1160. As shown in the figure, the network adapter 1160 communicates with other modules of the electronic equipment 1100 via the bus 1130. It should be understood that although not shown in the figure, other hardware and/or software modules may be used in combination with the electronic equipment 1100, including but not limited to: microcodes, a device driver, a redundant processing unit, an external disk drive array, a RAID system, a tape driver, a data backup storage system, etc.

Through the description of the above embodiments, those skilled in the art can easily understand that the example embodiments described here can be implemented by software, or can be implemented by combining software with necessary hardware. Therefore, the technical solution according to the embodiments of the present disclosure may be embodied in the form of a software product, and the software product may be stored in a non-volatile storage medium (which may be a CD-ROM, a U disk, a mobile hard disk, etc.) or on the network, and includes instructions enabling a computing device (which may be a personal computer, a server, a terminal device, or a network device, etc.) to execute the method according to the embodiments of the present disclosure.

In an exemplary embodiment of the present disclosure, a computer-readable storage medium is further provided, storing a program product capable of implementing the above-mentioned method in this specification. In some possible implementations, various aspects of the present invention may also be implemented in the form of a program product, which includes program codes. When the program product runs on a terminal device, the program codes are used to enable the terminal device to execute the steps according to various exemplary implementations of the present invention described in the "exemplary method" section of the specification.

The program product for implementing the above method according to the implementations of the present invention may adopt a portable compact disk read-only memory (CD-ROM) and include program codes, and may run on a terminal device, such as a personal computer. However, the program product of the present invention is not limited to this. Herein, the readable storage medium may be any tangible medium that includes or stores a program, and the program may be used by or combined with an instruction execution system, apparatus or device.

The program product may adopt one readable medium or any combination of one or more readable media. The readable medium may be a readable signal medium or a readable storage medium. An example of the readable storage medium may be, but is not limited to electric, magnetic, optical, electromagnetic, infrared, or semiconductor systems, apparatuses or devices, or any combination of the above. A more specific example (a non-exhaustive list) of the readable storage medium may include: an electrical connection with one or more wires, a portable disk, a hard disk, a random access memory (RAM), a read-only memory (ROM), an erasable programmable read-only memory (EPROM or flash memory), a fiber, a portable compact disk read-only memory (CD-ROM), an optical memory, a magnetic memory, or any suitable combination of the above.

The computer-readable signal medium may include data signals in a baseband or propagated as part of carriers, in which readable program codes are carried. The propagated data signals may be in various forms, including but not limited to electromagnetic signals, optical signals or any suitable combination thereof. The readable signal medium may also be any readable medium beyond the readable storage media. The readable medium is capable of sending, propagating or transmitting a program used by or in combination with an instruction execution system, apparatus or device or a combination thereof.

The program codes included in the readable medium may be transmitted by any appropriate medium, including but not limited to wireless, wired, optical cable, RF, etc., or any appropriate combination of the above.

The program codes for executing operations of the present invention may be compiled in one or more programming languages. The programming languages include object-oriented programming languages, such as Java and C++, and also include conventional procedural programming languages, such as "C" language or similar programming languages. The program code may be completely executed on a user's computing device, partially executed on a user's device, executed as a separate software package, partially executed on a user's computing device and partially executed on a remote computing device, or completely executed on a remote computing device or server. In the circumstance involving a remote computing device, the remote computing device may be connected to a user's computing device over any type of network, including a local area network (LAN) or wide area network (WAN), or may be connected to an external computing device (for example, connected over the Internet by means of an Internet service provider).

In addition, the above drawings are merely schematic illustrations of the processes included in the method according to the exemplary embodiments of the present invention, and are not intended for limitation. It is easy to understand that the processes shown in the above drawings do not indicate or limit the time sequence of the processes. In addition, it is also easy to understand that these processes may be executed synchronously or asynchronously in multiple modules, for example.

A person skilled in the art would readily conceive of other embodiments of the present disclosure after considering the specification and practicing the invention disclosed herein. The present application is intended to cover any variations, uses or adaptive changes of the present disclosure. These variations, uses or adaptive changes follow the general principle of the present disclosure and include common general knowledge or conventional technical means in the technical field that are not disclosed in the present disclosure. The specification and the embodiments are only regarded as exemplary, and the true scope and conception of the present disclosure are indicated by the claims.

INDUSTRIAL APPLICABILITY

In the embodiments of the present disclosure, a plurality of pad state setting schemes for setting adjacent pads to different states are determined according to the positional arrangement of pads in the chip, and then a test voltage setting scheme is determined according to the pad state setting schemes, which can maximize the operating differential voltage between adjacent pads in the finally selected test voltage setting scheme, thereby effectively improving the voltage test intensity when the chip participates in an environmental test, and improving the reliability of the environmental test result.

The invention claimed is:

1. A chip testing method, comprising:
   determining, according to pad distribution information of a target chip, positions of set state pads and positions of non-set state pads in the target chip, the set state pads being pads with set states, and the set states comprising a first state or a second state;
   determining a plurality of pad state setting schemes according to the positions of the set state pads and the positions of the non-set state pads, the pad state setting schemes comprising setting each of the non-set state pads to the first state or the second state;

determining a test voltage setting scheme satisfying a preset condition according to information of differential voltage pad pairs in each of the pad state setting schemes, each of the differential voltage pad pairs comprising two adjacent pads in different states; and pressurizing solder balls of the target chip based on the test voltage setting scheme according to a corresponding relationship between pads of the target chip and the solder balls, and performing an environmental test on the target chip.

2. The chip testing method according to claim 1, wherein the determining the plurality of pad state setting schemes according to the positions of the set state pads and the positions of the non-set state pads comprises:

determining a set state of each of the set state pads in the target chip;

when a set state of one of the set state pads is the first state, determining a set state of at least one non-set state pad adjacent to the set state pad as the second state, or, when a set state of one of the set state pads is the second state, determining a set state of at least one non-set state pad adjacent to the set state pad as the first state; and when a set state of one of the non-set state pads is determined as the first state, determining a set state of at least one adjacent non-set state pad as the second state, or, when a set state of one of the non-set state pads is determined as the second state, determining a set state of at least one adjacent non-set state pad as the first state.

3. The chip testing method according to claim 1, wherein the determining the test voltage setting scheme satisfying the preset condition according to the information of differential voltage pad pairs in each of the pad state setting schemes comprises:

obtaining a number of the differential voltage pad pairs in each of the pad state setting schemes;

obtaining, in a pad state setting scheme of the pad state setting schemes with a maximum number of the differential voltage pad pairs, a voltage at which each pad set in the first state is in the first state, and a voltage at which each pad set in the second state is in the second state; and determining the test voltage setting scheme according to the voltage of the first state of each of the pads or the voltage of the second state of each of the pads.

4. The chip testing method according to claim 1, wherein the determining the test voltage setting scheme satisfying the preset condition according to the information of differential voltage pad pairs in each of the pad state setting schemes comprises:

obtaining positions of the differential voltage pad pairs in the target chip in each of the pad state setting schemes;

determining, according to the positions of the differential voltage pad pairs in the target chip, an occupied area of differential voltage pads corresponding to each of the pad state setting schemes;

obtaining, in a pad state setting scheme of the pad state setting schemes with a maximum occupied area of differential voltage pads, a voltage at which each pad set in the first state is in the first state, and a voltage at which each pad set in the second state is in the second state; and determining the test voltage setting scheme according to the voltage of the first state of each of the pads or the voltage of the second state of each of the pads.

5. The chip testing method according to claim 1, wherein the first state of each pad is a design maximum voltage state connected to the pad, and the second state is a design minimum voltage state connected to the pad.

6. The chip testing method according to claim 1, wherein the set state pads comprise power pads, ground pads and set bias pads, and the set bias pads are configured to set the target chip in a low power consumption state.

7. A chip testing apparatus, comprising:

one or more processors; and a storage apparatus, configured to store one or more programs, wherein the one or more programs, when executed by the one or more processors, cause the one or more processors to execute operations of:

determining, according to pad distribution information of a target chip, positions of set state pads and positions of non-set state pads in the target chip, the set state pads being pads with set states, and the set states comprising a first state or a second state;

determining a plurality of pad state setting schemes according to the positions of the set state pads and the positions of the non-set state pads, the pad state setting schemes comprising setting each of the non-set state pads to the first state or the second state;

determining a test voltage setting scheme satisfying a preset condition according to information of differential voltage pad pairs in each of the pad state setting schemes, each of the differential voltage pad pairs comprising two adjacent pads in different states; and pressurizing solder balls of the target chip based on the test voltage setting scheme according to a corresponding relationship between pads of the target chip and the solder balls, and performing an environmental test on the target chip.

8. A non-transitory computer-readable storage medium, storing a program thereon, wherein when the program is executed by a processor, the chip testing method according to claim 1 is implemented.

* * * * *